United States Patent [19]

Drekmeier

[11] Patent Number: 5,581,227
[45] Date of Patent: Dec. 3, 1996

[54] HYBRID CIRCUIT HAVING CERAMIC STRIP TO INCREASE LOADING CAPACITY

[75] Inventor: Karl-Gerd Drekmeier, Unterhaching, Germany

[73] Assignee: Siemens Aktiengesellschaft, Munich, Germany

[21] Appl. No.: 242,200

[22] Filed: May 13, 1994

[30] Foreign Application Priority Data

Dec. 17, 1993 [DE] Germany .............................. 9319473 U

[51] Int. Cl.⁶ ..................................................... H01C 1/08
[52] U.S. Cl. ............................. 338/51; 338/159; 338/306; 361/704
[58] Field of Search ................................ 338/51, 57, 159, 338/292, 293, 306, 307, 308; 361/388

[56] References Cited

U.S. PATENT DOCUMENTS

| | | | |
|---|---|---|---|
| 3,766,440 | 10/1973 | Baird | 317/100 |
| 3,792,383 | 2/1974 | Knappenberger | 333/205 |
| 5,053,923 | 10/1991 | Niemetz | 361/388 |
| 5,254,969 | 10/1993 | Caddock, Jr. | 338/308 |
| 5,304,977 | 4/1994 | Caddock | 338/275 |

*Primary Examiner*—Tu Hoang
*Attorney, Agent, or Firm*—Hill, Steadman & Simpson

[57] ABSTRACT

A hybrid circuit unit having a film resistor on a circuit carrier and a ceramic stripe having an area of at least approximately the same size as the film resistor is secured in a highly thermally conductive way to at least one side of the plate-shaped circuit carrier.

22 Claims, 3 Drawing Sheets

HYBRID CIRCUIT HAVING CERAMIC STRIP TO INCREASE LOADING CAPACITY

BACKGROUND OF THE INVENTION

The present invention generally is directed to circuit arrangements and/or methods for improving the short term loading capacity of a circuit. More specifically, the invention is directed to arrangements and/or methods for increasing the loading capacity of a hybrid circuit arrangement having a resistive coating applied on at least one side of a glass or ceramic plate-shape circuit carrier.

Electrical circuits employing integrated resistors, for example, those that are utilized as protective resistors in public telephone switching systems, usually are manufactured using thick film or thin film technology. Yet such circuits should be capable of handling, at least for a brief durations, high electrical power loadings, for example, as occurs particularly in conjunction with network failures.

Background information relating to such circuits is disclosed in U.S. Pat. No. 5,254,969, the disclosure of which is fully incorporated herein by reference. As described therein, it is essential that balancing resistors, and line cards, perform in certain ways demanded by telephone companies, at three specified or standard levels of adverse conditions. The first level is one where the line card will survive and continue to function properly despite certain conditions, one being lightning transients. The second level relates to a condition where the balancing resistors are continuously overheating, for example because the line card is overheating due to being improperly connected by a technician. Relative to the this second level, there must be a thermal cutoff action to discontinue flow of current before the line-card circuit board starts to burn. The third level is one where there is a sudden application of high voltage, for example when a power line drops on the telephone line. Relative to this third level, current flow must be substantially instantaneously discontinued or small-diameter wires in the telephone system may melt.

To address the foregoing, U.S. Pat. No. 5,254,969 describes flat film type resistors intentionally caused to thermal shock fracture in response to a predetermined high-voltage overload condition. Heat sink portions for the resistors are formed in the circuit board by etching during the manufacture of the board.

Film circuits having an $Al_2O_3$ substrate approximately 1 mm thick with a resistive coating applied on both sides and which can be loaded with approximately 2 kw for 100 milliseconds before a substrate failure occurs are commercially available. Therefore, it is not only the relatively short loading duration that is of concern but also the degree to which a failed substrate fragments or fractures since this fragmentation can lead to potentially conductive splinters that can be disbursed in an uncontrollable and dangerous fashion.

SUMMARY OF THE INVENTION

An object of the present invention is to provide a hybrid circuit arrangement having a resistive coating (film resistor) applied on at least one side of a plate-shaped circuit carrier, which circuit handles a substantially greater short term or brief duration electrical loading and in which fragmentation is prevented at higher loads.

In an embodiment of the invention, the foregoing is achieved in that a ceramic strip or stripe having at least approximately the same area as the film resistor containing portion of the circuit carrier (substrate) and preferably the same as the area of the carrier itself is secured in a highly thermally conductive manner to at least one side of the circuit carrier. When the ceramic stripe is made of the same material as the substrate and has approximately the same thickness as that of the circuit carrier, one can succeed in nearly doubling the short term or brief duration loading of the film circuit without changing the circuit. In particular, this can occur when an $Al_2O_3$ ceramic stripe is glued to the back side of an $Al_2O_3$ circuit carrier having a thickness of 1 mm to ensure a thermal expansion behavior that is similar to that of the circuit carrier. Additionally, the short term or brief duration heat sinking function can only be met by ceramic materials having a high thermal conductivity.

In order to avoid breakdowns, care must also be exercised by taking into consideration the insulating properties of the material employed. Past attempts by the inventors to increase the heat capacity directly by enlarging the thickness of the circuit carrier itself lead only to limited success since processing difficulties, for example, in the through contactings, occurred within the framework of standard film technology.

The foregoing and other features and aspects of the invention will become apparent in the following detailed description of the presently preferred embodiments with reference to the accompanying drawings.

DETAILED DESCRIPTION OF THE PRESENTLY PREFERRED EMBODIMENTS

Figure 7:
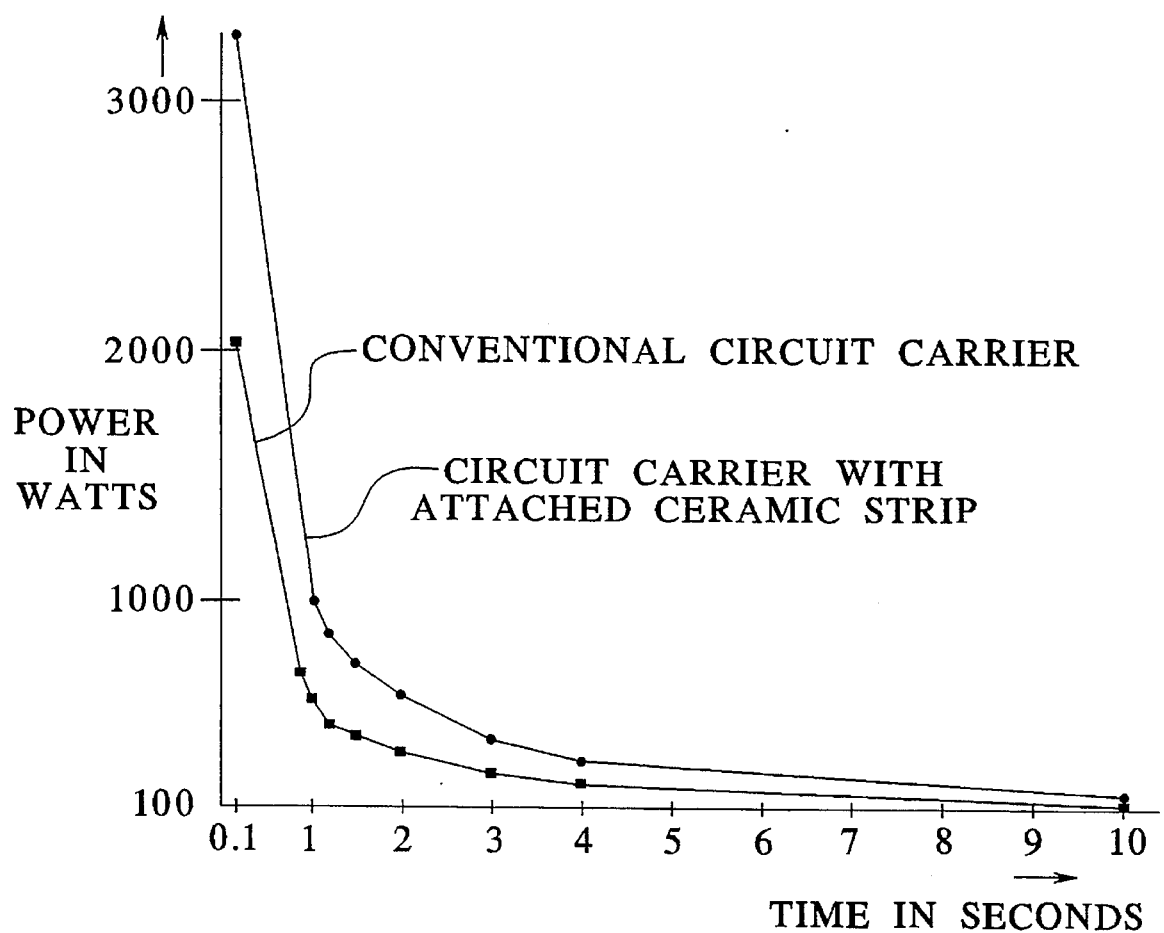
FIG. 7 illustrates loading curves for a conventional film circuit and a film circuit embodying principles of the invention.

As described above, the present invention provides for increased, at least short term, loading of a film circuit by providing attachment to the circuit carrier of a ceramic stripe. "Stripe" and "strip" are used interchangeably herein. The resulting improvement is best illustrated in FIG. 7 wherein loading curves for a conventional film circuit and a film circuit embodying principles of the invention are compared. Reference therefore will first be made to FIG. 7.

In FIG. 7, the loading over time of a known circuit carrier as well as the loading over time of a circuit carrier of the invention (which is provided with a ceramic stripe) can be seen. What is especially important and notable is the relatively great difference in the short term time frame or brief duration domain, i.e. approximately within the first 0.1 second. As can be seen, an even higher loading can be incurred before an interruption of the interconnects or, respectively, film resistors due to cracks in the films or in the circuit carrier arises. A ceramic stripe that holds the broken circuit carrier together from at least one side, however, prevents fragmentation.

Figure 1:
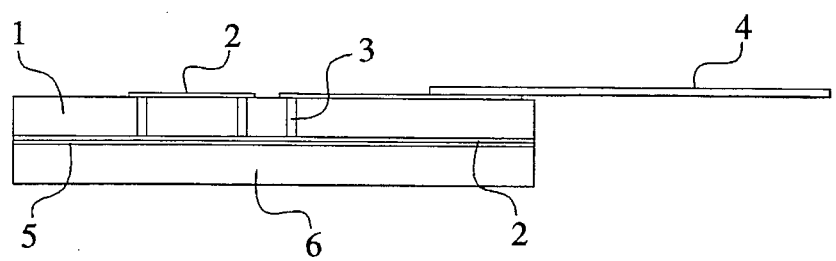
FIG. 1 illustrates a representational side view of a first embodiment of the invention.
Figure 6:
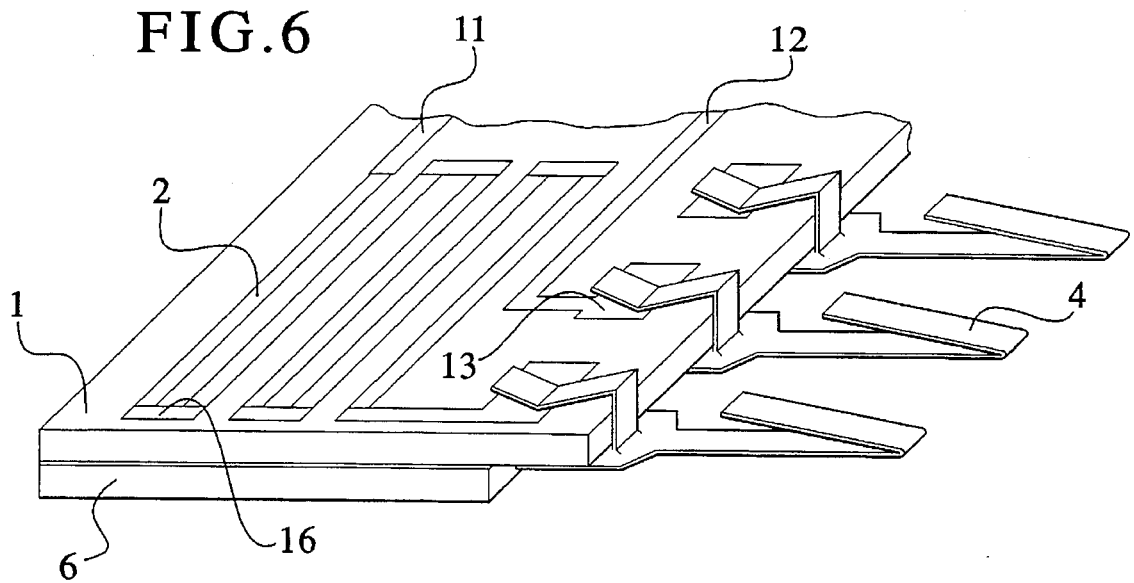
FIG. 6 illustrates in perspective view a sixth embodiment of the invention.

In FIG. 1 there is illustrated a first embodiment of the invention wherein a circuit carrier 1 having, for example, film resistors 2 applied on both sides of the carrier 1. The remainder of the circuit is not illustrated but can be understood by those skilled in the art. The resistors 2 can be applied surface-wide or meander-like (i.e., in coils as illustrated in FIG. 6). As illustrated, the connection of the two film sides occurs via through contactings or vias 3. An outboard terminal 4 is constructed as a single-in-line (SIL) terminal. A ceramic stripe 6 having a thickness of the same as that of a circuit carrier 1 is secured to the backside of the carrier with a suitable thermally conductive glue 5. The ceramic stripe is shown as having an area approximately that of the carrier 5.

The loading curve in FIG. 7 of a carrier embodying principles of the invention is that which corresponds to the embodiment illustrated in FIG. 1. As can be appreciated, the embodiment illustrated in FIG. 1 can be especially cost-beneficial in terms of construction. As can be further appreciated, the short term or brief duration loading can be further improved by forming the ceramic stripe 6 to be thicker and/or composed of beryllium oxide or of aluminum nitride ceramic.

Figure 2:
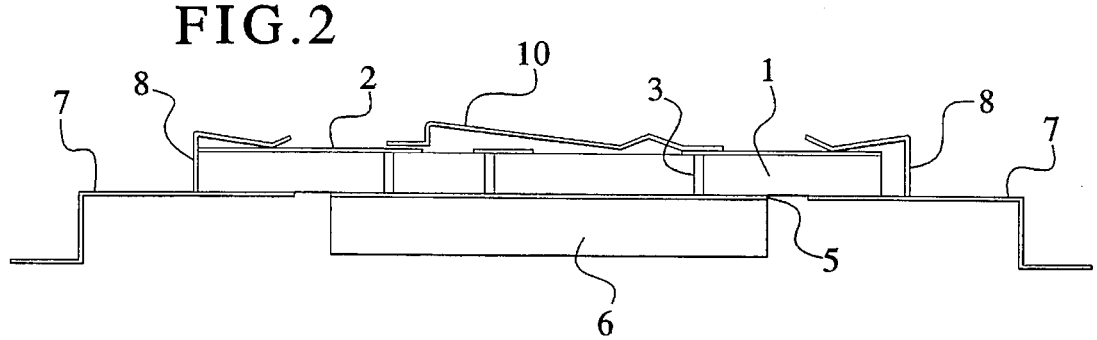
FIG. 2 illustrates a representational side view of a second embodiment of the invention.

In FIG. 2 there is illustrated a second embodiment of the invention, which embodiment has dual in line connections 7 and an additional comb terminal 8. The backside ceramic stripe 6 is substantially thicker than the circuit carrier 1 and also is somewhat smaller than it, so that the circuit carrier 1 has an edge region projecting beyond the area of the ceramic stripe 6 at which it can be contacted with the comb terminals 8. Additionally shown is a terminal fuse 10, the fuse 10 serving to interrupt electrical voltage of the circuit given an excessively high long term loading. The thermal fuse 10 is constructed in a known way such that the aforementioned network failures are too short to lead to a melt down or, respectively, response of the fuse. On the other hand, the thermal fuse 10 is constructed such that it is blown given a long term load of approximately 600 volts to thereby electrically interrupt the circuit on the circuit carrier 1.

Figure 3:
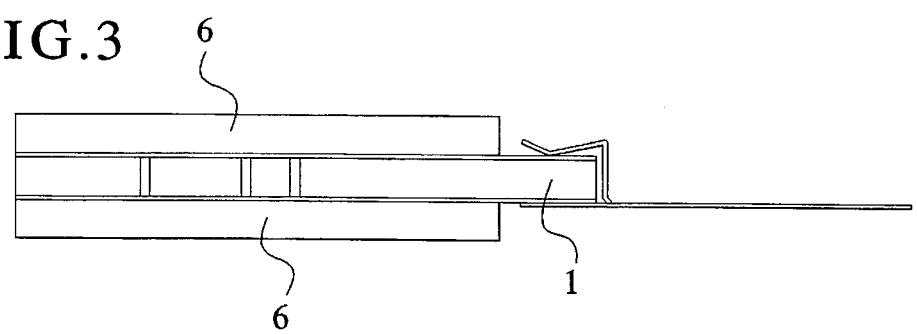
FIG. 3 illustrates a representational side view of a third embodiment of the invention.

In FIG. 3 there is illustrated an SIL embodiment having heat-relieving ceramic stripes 6 applied on both sides of the carrier 1. In this embodiment a further increase in the short term or brief duration loading is possible. A recess in the respective ceramic stripe 6 is provided for the introduction therein of a thermal fuse.

Figure 4:
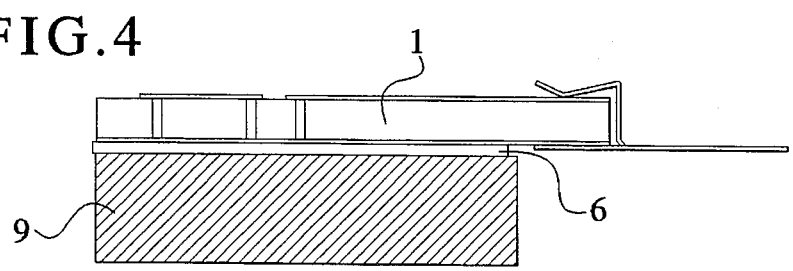
FIG. 4 illustrates a representational side view of a fourth embodiment of the invention.

In FIG. 4 there is illustrated an embodiment of the invention wherein the ceramic stripe 6 is at most 0.5 mm thick but preferably only approximately 0.1 mm thick. At a side or surface facing away from the circuit carrier 1, the ceramic stripe 6 is supplemented or complimented by a metal profile of, for example, copper or aluminum that is secured thereto in a highly thermally conductive manner.

Figure 5:
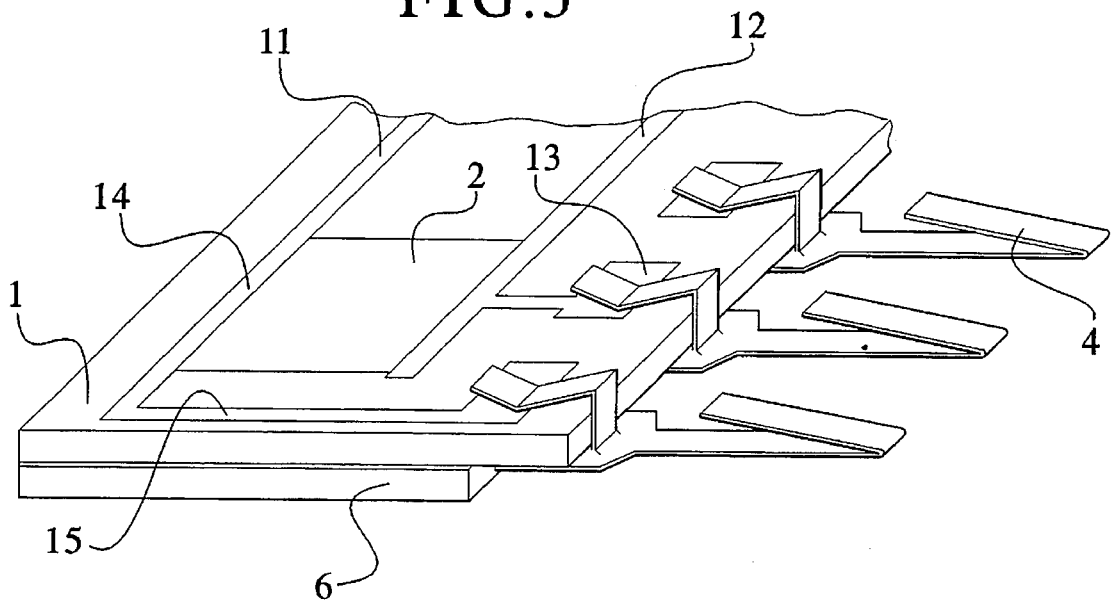
FIG. 5 illustrates in perspective view a fifth embodiment of the invention.

FIGS. 5 and 6 each respectively illustrate embodiments having outboard terminals 4 of a type that can be employed in all of the above embodiments of the invention.

In the embodiments of FIG. 5, the resistive coating 2 is applied planarly between contacts 11 and 12 which extend parallel to the longitudinal direction of the circuit carrier 1, whereby the pads 13 for the outboard terminals 4 are arranged at a long side of the circuit carrier 1. The illustrated contacting of the film resistors 2 at the terminals 13 and 14 lying oppositely thereto is advantageous since the interconnect 15 is intentionally interrupted given breakage or fragmentation of the circuit carrier 1 due to an excessively high short term or brief duration loading, this effecting an immediate disconnection of the thermal or, respectively, electrical overload for the assembly.

In the embodiment of FIG. 6, the resistive coating is produced in a meandering fashion (i.e., in coils) and comprises bypasses 16 at the curves (i.e., brights), these bypasses having a substantially lower sheet resistance. This construction serves the purpose of assuring the necessary surge dielectric strength of more than 1 kV.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

I claim as my invention:

1. A hybrid circuit unit comprising:
a flat circuit carrier having two sides;
a film resistor applied to at least one side of the circuit carrier;
and a ceramic stripe, having an area of contact with the circuit carrier at least approximately the same as an area of contact of the film resistor with the circuit carrier, which ceramic stripe is secured to at least the other side of the circuit carrier to sink heat from the film resistor and to hold the circuit carrier together should the circuit carrier become fragmented.

2. The hybrid circuit unit of claim 1, wherein the ceramic stripe is made from material selected from the group consisting of aluminum oxide, beryllium oxide and aluminum nitride.

3. The hybrid circuit unit of claim 1, wherein the ceramic stripe is secured to the circuit carrier with thermally conductive glue.

4. The hybrid circuit unit of claim 1 or 3, wherein the circuit carrier and the ceramic stripe are both composed of aluminum oxide, each of the circuit carrier and the ceramic stripe having a thickness of approximately 1 mm.

5. The hybrid circuit unit of claim 1, 2 or 3, wherein the ceramic stripe is at most 0.5 mm thick and a metal profile is secured to a side of the ceramic stripe facing away from the circuit carrier.

6. The hybrid circuit unit of claim 1, 2 or 3, wherein the film resistor is formed to have a meandering outline and to have bypasses with substantially lower heat resistance at bights in the meandering outline.

7. The hybrid circuit unit of claim 1, 2 or 3, wherein the film resistor is applied planarly between a pair of interconnect traces, the pair of interconnect traces extending parallel to a longitudinal direction of circuit carrier pads are arranged at a long side of the circuit carrier.

8. The hybrid circuit unit of claims 1, 2 or 3 wherein the film resistor is connected to interconnect pads arranged in an edge region of the circuit carrier, which edge region projects beyond the ceramic stripe and is provided with a comb terminal operatively connected to the interconnect pads.

9. The hybrid circuit unit of claims 1, 2 or 3, further comprising a thermal fuse that is electrically connected to the film resistor and is secured on the circuit carrier.

10. The hybrid circuit arrangement of claim 1, wherein the circuit carrier is made of glass.

11. The hybrid circuit arrangement of claim 1, wherein the circuit carrier is made of ceramic.

12. A hybrid circuit unit comprising:

a flat circuit carrier having two sides, a film resistor applied to at least one side of the circuit carrier;

and a ceramic stripe, having an area of contact with the circuit carrier approximately the same as an area of the circuit carrier, which ceramic stripe is secured to at least the other side of the circuit carrier to sink heat from the film resistor and to hold the circuit carrier together should the circuit carrier become fragmented.

13. The hybrid unit circuit of claim 12, wherein the ceramic stripe is made from material selected from the group consisting of aluminum oxide, beryllium oxide and aluminum nitride.

14. The hybrid circuit unit of claim 12, wherein the ceramic stripe is secured to the circuit carrier with thermally conductive glue.

15. The hybrid circuit unit of claim 12 or 14, wherein the circuit carrier and the ceramic stripe are both composed of aluminum oxide, each of the circuit carrier and the ceramic stripe having a thickness of approximately 1 mm.

16. The hybrid circuit unit of claim 12, 13 or 14, wherein the ceramic stripe is at most 0.5 mm thick and a metal profile is secured to a side of the ceramic stripe facing away from the circuit carrier.

17. The hybrid circuit unit of claim 12, 13 or 14, wherein the film resistor is formed to have a meandering outline and to have bypasses with substantially lower heat resistance at bights in the meandering outline.

18. The hybrid circuit unit of claim 12, 13 or 14, wherein the film resistor is applied planarly between a pair of interconnect traces, the pair of interconnect traces extending parallel to a longitudinal direction of circuit carrier pads are arranged at a long side of the circuit carrier.

19. The hybrid circuit unit of claims 12, 13 or 14 wherein the film resistor is connected to interconnect pads arranged in an edge region of the circuit carrier, which edge region projects beyond the ceramic stripe and is provided with a comb terminal operatively connected to the interconnect pads.

20. The hybrid circuit unit of claims 12, 13 or 14, futher comprising a thermal fuse that is electrically connected to the film resistor and is secured on the circuit carrier.

21. The hybrid circuit arrangement of claim 12, wherein the circuit carrier is made of glass.

22. The hybrid circuit arrangement of claim 12, wherein the circuit carrier is made of ceramic.

* * * * *